United States Patent [19]

Hart et al.

[11] Patent Number: 4,795,989

[45] Date of Patent: Jan. 3, 1989

[54] MMW MICROSTRIP COUPLER HAVING MOVABLE TEST PROBE

[75] Inventors: Rebecca A. Hart, Plymouth; Michael J. Gawronski, Minneapolis, both of Minn.

[73] Assignee: Honeywell, Inc., Minneapolis, Minn.

[21] Appl. No.: 154,748

[22] Filed: Feb. 11, 1988

[51] Int. Cl.[4] .................. H01P 5/19; G01R 27/04
[52] U.S. Cl. .................. 333/116; 324/58 R; 333/33
[58] Field of Search .................. 333/109, 116, 33; 324/58 R, 58 A, 58 B, 58.5 R, 58.5 A, 58.5 B, 95

[56] References Cited

U.S. PATENT DOCUMENTS 3,012,210 12/1961 Nigg ................................ 333/116
3,245,013 4/1966 Forge ................................ 333/33

Primary Examiner—Paul Gensler
Attorney, Agent, or Firm—C. Lamont Whitham; Michael E. Whitham

[57] ABSTRACT

A microwave and millimeter wave hybrid or monolithic microstrip test probe assembly provides a noninvasive radio frequency test point in a microstrip circuit. The probe assembly comprises a microstrip coupler. (12) adjacent a microstrip line (10) in the circuit for sampling a small amount of microwave energy propagating along said microstrip line. A stripline circuit (20, 22 and 24) is connected to the microstrip coupler. The stripline circuit includes a pad area (24) and a probe (26) moveable to overlay the pad area. The probe forms a ground plane with respect to the pad area, and a coaxial line (34) has an outer conductor connected to the probe and an inner conductor projecting through a hole in the probe. The probe assembly provides an RF test point within a microstrip circuit which allows an accurate, calibrated and repeatable means of sampling a microstrip signal while not affecting the normal performance of the hybrid or monolithic circuit. The probe (26) is removable and is introduced into the circuit for testing purposes.

7 Claims, 2 Drawing Sheets

MMW MICROSTRIP COUPLER HAVING MOVABLE TEST PROBE

BACKGROUND OF THE INVENTION

1. Field of the Invention

The present invention generally relates to a test probe assembly for electrical measuring and testing apparatus and, more particularly, to a test probe used to sample millimeter waves (MMW) or radio frequency (RF) signals in a microstrip integrated circuit (MIC) or millimeter wave monolithic integrated circuit (MIMIC).

2. Description of the Prior Art

The invention arose from a need to be able to make noninvasive measurements of signal voltages and frequencies of a millimeter wave hybrid or monolithic transceiver which is fabricated using microstrip technology. Such measurements are necessary to properly tune and trouble shoot the microstrip transceiver. A problem exists in microstrip waveguide circuits to provide an RF test point within the circuit which provides an accurate, calibrated and repeatable means of sampling a microstrip signal while at the same time not appreciably affecting the normal performance of the circuit. It is common, for example, in low frequency analog circuits to provide internal test points to facilitate the measurements of signal voltages in order to calibrate or trouble shoot the circuits. However, at microwave and millimeter wave frequencies, it is not possible to merely insert test points in the microwave circuit without greatly affecting the performance of the circuit and distorting the very signals which are desired to be measured.

A few examples of the prior art will illustrate the point. U.S. Pat. No. 4,070,619 to Trefney discloses a voltage standing wave ratio (VSWR) meter which uses an inductive loop in a microstrip configuration to provide the signal input to the meter. While the internal circuitry uses microstrip construction, the VSWR meter is for use in coaxial measurement systems, not microstrip circuits.

U.S. Pat. No. 4,211,911 to Dehn discloses a microwave directional coupler which comprises a microstrip transmission line terminating in a pair of detectors and mounted over apertures in a waveguide. The approach taken by Dehn is applicable for use in waveguide systems only, and the radio frequency (RF) sensing mechanism is not transferrable to microstrip circuits.

U.S. Pat. No. 3,704,410 to O'Brien and U.S. Pat. No. 3,753,086 to Shoemaker, Jr., show examples of microwave detector circuits using conventional waveguide structures. O'Brien uses a bridge technique which is designed to measure characteristics of passive elements; e.g., attenuation. It is unsuitable for use in measuring parameters such as power and frequency of active transceivers while operating. Shoemaker, Jr., discloses an apparatus which is limited in use in waveguide systems only; microstrip millimeter wave circuits are a unique problem not addressed by this patent.

U.S. Pat. No. 4,438,395 to Ekdahl discloses a capacitively-coupled inductive sensor for a coaxial line. The Ekdahl approach is limited to operating in transmission lines with outer conductors, which is not applicable to microstrip circuits.

U.S. Pat. No. 4,535,307 to Tsukii discloses a microwave package which is useful for testing and calibrating microwave circuits. A device to be tested is placed within a test fixture, thereby making tests of the device while in operating service impossible.

SUMMARY OF THE INVENTION

It is therefore an object of the present invention to provide a test probe assembly for accurately sampling signals in a hybrid or monolithic microstrip circuit without altering the normal performance of the circuit.

According to the invention, the RF signal on the microstrip is sampled by means of a coupler and fed onto a microstrip pad. This pad serves as the substrate-based complement to a similarly shaped RF probe which is lowered onto the microstrip circuit from above and is positioned atop the substrate pad. The pad area becomes a stripline circuit, with dielectric above and below the metallization, when the probe is in place. The stripline circuit is configured to efficiently sidelaunch the microstrip fields into the coaxial line of the test probe. From this point, the sampled signal-under-test can be routed via coaxial line to sensors, test equipment, and so forth.

In the preferred embodiment of the invention, the coupler and the substrate pad are a permanent part of the microstrip circuit. Because such a low percentage of the signal power is sampled, the coupler and pad have negligible effect on the circuit-under-test's operation while the probe is in use or not in use. The probe can be left in place or removed without measurably affecting the performance of the circuit under test.

BRIEF DESCRIPTION OF THE DRAWINGS

The forgoing and other objects, aspects and advantages of the invention will be better understood from the following detailed description of a preferred embodiment of the invention with reference to the drawings, in which.

DETAILED DESCRIPTION OF THE PREFERRED EMBODIMENT OF THE INVENTION

Figure 1:
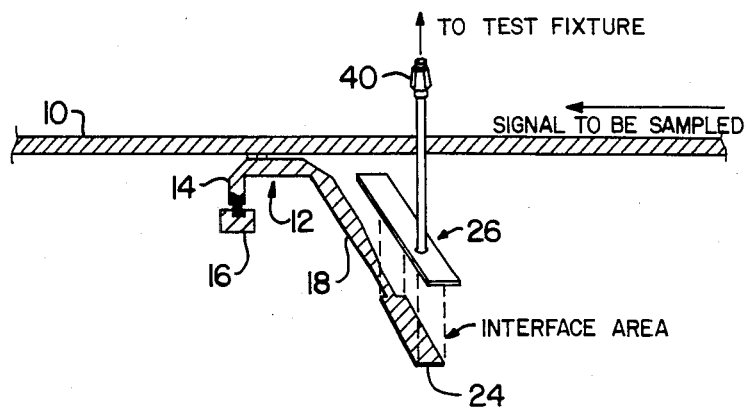
FIG. 1 is pictorial diagram of the test probe and coupler assembly according to the invention.

Referring now to the drawings, and more particularly to FIG. 1, there is shown a microstrip 10 which is part of a microwave or millimeter wave microstrip hybrid or monolithic circuit such as, for example, a transceiver. Adjacent the microstrip 10 is a coupler 12 which is parallel to the microstrip and close enough thereto that a small amount of microwave energy is launched onto the coupler. The coupler has two ends, one of which, 14, projects away from microstrip 10 at an angle of approximately 45 and terminates in a matching impedance 16, and the other of which, 18, projects away from microstrip at a 90 angle. It should be noted that the angles that the microstrip lines make with respect to the coupler are dictated mostly by mechanical requirements and do not affect the electrical performance.

Figure 2:
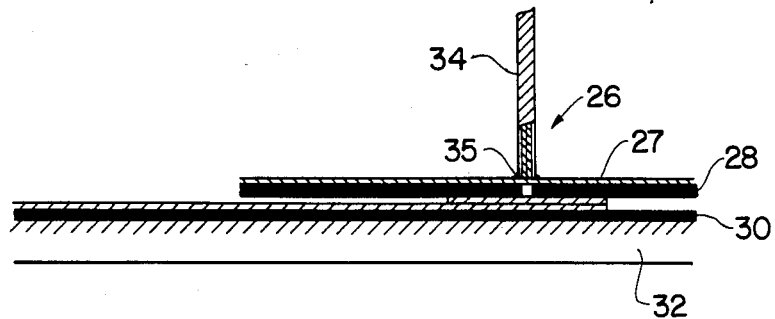
FIG. 2 is a cross-sectional view of the test probe assembly.
Figure 3:
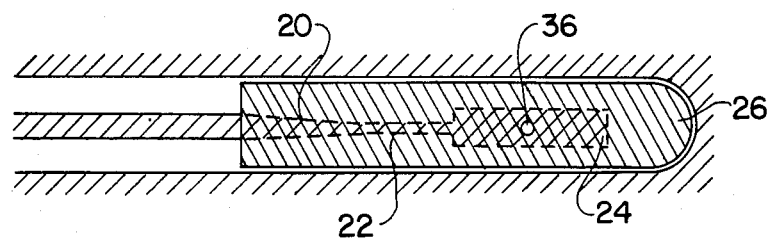
FIG. 3 is a top view of the test probe assembly.
Figure 4:
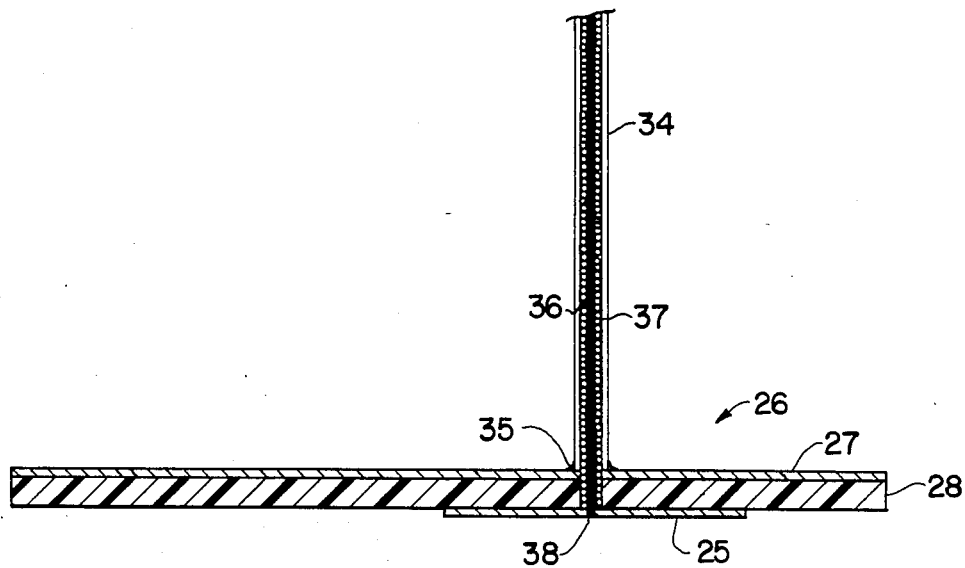
FIG. 4 is a cross-sectional view showing in more detail the construction of the test probe.
Figure 5:
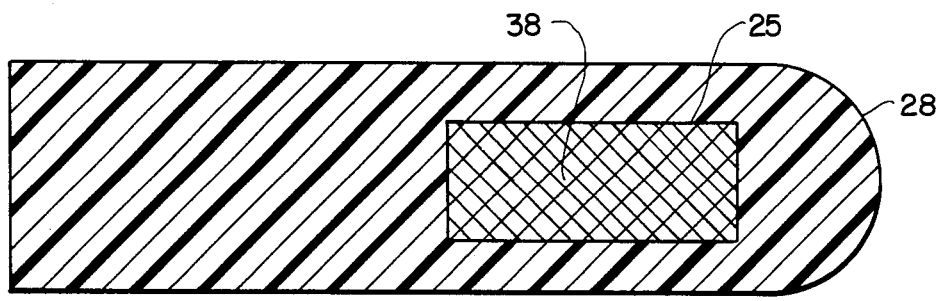
FIG. 5 is a bottom view of the test probe.

As best seen in FIG. 3, the end 18 of the coupler 12 includes a tapered stripline transition 20 followed by a narrow stripline section 22 which terminates in a probe pad 24. The interface area of the test probe assembly includes these three parts, the test probe 26 itself comprising the upper conductor or ground plane 27 for the stripline, as shown in the cross-sectional views of FIGS. 2 and 4. More specifically, the test probe 26 comprises, in addition to the upper conductor or ground plane 27, a pad 25 of identical dimensions to that of the pad 24, the pad 25 being separated from the upper conductor or ground place 27 by dielectric 28. This structure is best illustrated in FIGS. 4 and 5. When the test probe 26 is lowered onto the probe pad 24, pad 25 makes a metal-to-metal contact with pad 24 and is in registry therewith.

The tapered stripline transition 20, stripline section 22 and the probe pad 24 are formed on a dielectric layer 30 which overlays the lower conductor or ground plane 32 of the stripline. It will be appreciated by those skilled in the art that metal areas 20, 22 and 24 area microstrip as they reside on a dielectric layer 30 of a substrate including lower conductor or ground plane 32, since there is no dielectric and ground plane over these areas. However, they are designed for performance as a stripline circuit and, in fact, become a stripline circuit when the probe 26 is in place, since the upper conductor or ground plane 27 and dielectric 28 complete the stripline circuit.

Also, as shown in FIGS. 2 and 4, the probe 26 forms part of a stripline-to-coax transition in which the outer conductor of a semirigid coaxial line 34 is soldered at 35 to the top surface of the test probe upperconductor or ground plane 27. As best shown in FIG. 4, the center conductor 36 and insulator 37 of the coaxial line projects through a hole in in the upper conductor or ground plane 27 and dielectric layer 28. The insulator 37 terminates at pad 25, but the center conductor 36 projects through a hole in pad 25 and is soldered at 38. This couples the microwave energy propagating along the stripline to the semirigid coaxial line 34.

As shown in FIG. 1, the coaxial line 34 is provided with a coaxial line connector 40 to which a flexible coaxial line (not shown) may be coupled for connecting to various calibration and measurement equipment. Alternatively, the coaxial connector could be connected to a coaxial-to-waveguide adapter. The choice is a matter of specific application. Most test equipment is waveguide-based at the higher frequencies. A coaxial line, although compact and necessary for some applications, is quite lossy in the millimeter wave frequency range.

A particular advantage of the test probe assembly according to the invention is that the test probe 26 is removable. The intent of the design is that the probe 26 would only be introduced into the circuit for testing purposes.

The millimeter wave microstrip test probe according to the invention can be configured to sample signals from either direction of a microstrip line. By appropriate dimension selection, it can be designed to work at any frequency with any type of substrate material. The invention is useful wherever there is a need to measure a signal traveling on a microstrip line to measure such parameters as frequency and relative power. The probe is noninvasive and provides a convenient RF test point internal to complex millimeter wave circuits such as tranceivers, but its application is not limited to tranceivers since it can be used on any form of microstrip circuit, open or closed, at any frequency. The probe assembly according to the invention is especially applicable to high-volume production test needs for diagnosing RF circuits.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A microwave and millimeter wave hybrid or monolithic microstrip test probe assembly for providing a noninvasive radio frequency test point in a microstrip circuit comprising:

microstrip coupler means adjacent a microstrip line in said circuit for sampling a small amount of microwave energy propagating along said microstrip line; and a stripline circuit connected to said microstrip coupler means, said stripline circuit including a pad area and a probe moveable to overlay said pad area, said probe forming a ground plane with respect to said pad area, and a coaxial line having an outer conductor electrically connected to said ground plane and an inner conductor projecting through said ground plane to said pad area.

2. The test probe assembly recited in claim 1 wherein said stripline circuit is connected to said microstrip coupler means by a tapered stripline transition connected between said microstrip coupler means and said pad area, said probe overlying both said pad area and said tapered stripline transition.

3. The test probe assembly recited in claim 2 wherein said movable probe is removable from said test point.

4. The test probe assembly recited in claim 2 wherein said test probe comprises a second pad area of identical dimensions with said first mentioned pad area, said second pad area being separated from said ground plane by a dielectric and making a metal-to-metal contact with said first mentioned pad area when said probe is lowered onto said pad area to form said stripline circuit.

5. The test probe assembly recited in claim 4 wherein said inner conductor of said coaxial line is electrically connected to said second pad area.

6. The test probe assembly recited in claim 5 wherein said movable probe is removable from said test point.

7. The test probe assembly recited in claim 1 further comprising coupling means connected to said coaxial line for providing a transition from said coaxial line to a measuring device.

* * * * *